Figure 1:
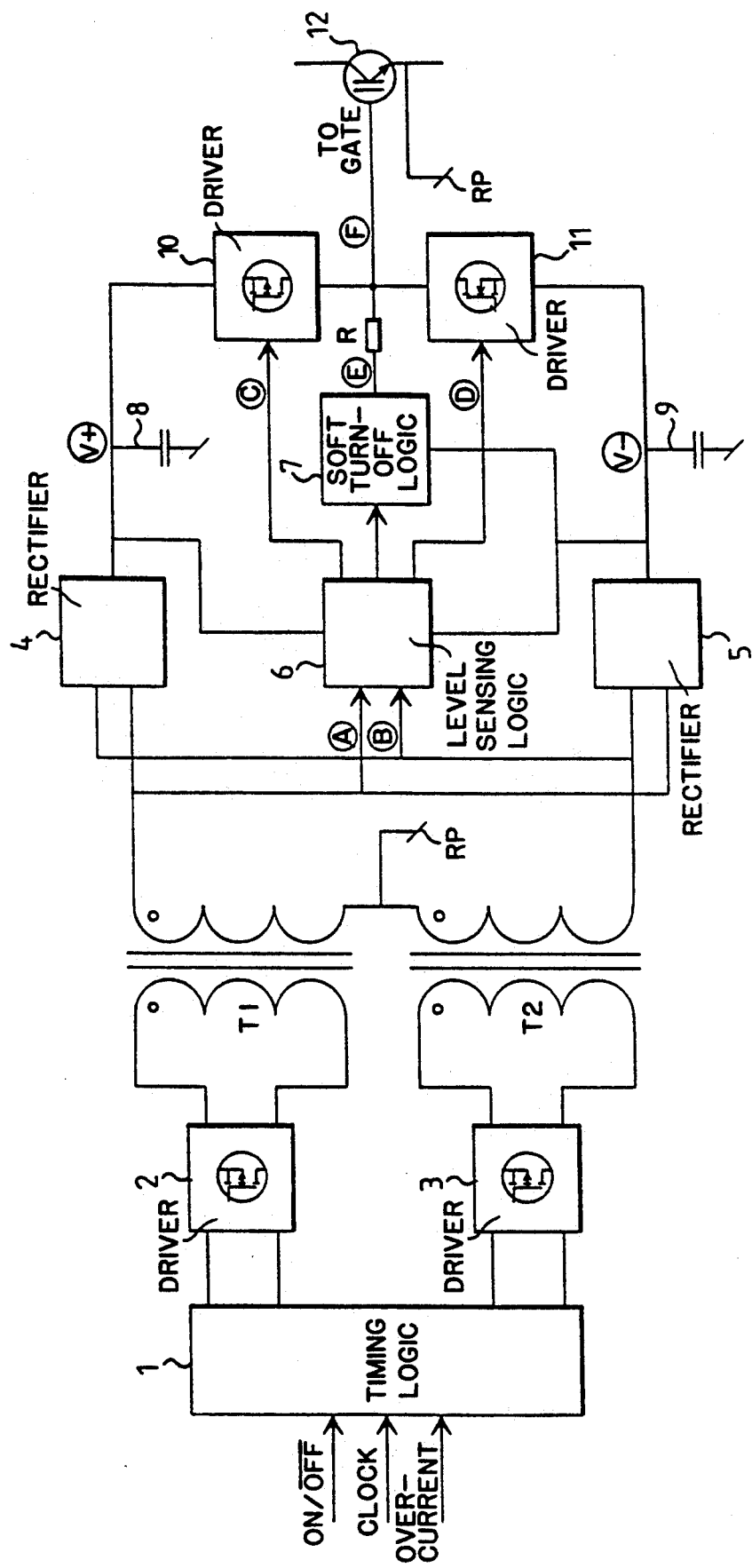

United States Patent [19]

Miettinen

[11] Patent Number: 5,301,085
[45] Date of Patent: Apr. 5, 1994

[54] CONTROL CIRCUIT FOR A SEMICONDUCTOR SWITCH

[75] Inventor: Erkki Miettinen, Helsinki, Finland

[73] Assignee: ABB Stromberg Drives Oy, Helsinki, Finland

[21] Appl. No.: 987,698

[22] Filed: Dec. 9, 1992

[30] Foreign Application Priority Data

Dec. 9, 1991 [FI] Finland .................... 915781

[51] Int. Cl.⁵ .................................. H02M 1/08
[52] U.S. Cl. ................................. 361/93; 307/270; 307/570; 363/131
[58] Field of Search ............ 307/270, 570, 571; 363/56, 131, 132; 361/93; H02M 1/08

[56] References Cited

U.S. PATENT DOCUMENTS

| | | | |
|---|---|---|---|
| 4,748,532 | 5/1988 | Commander et al. | 361/31 |
| 5,019,719 | 5/1991 | King | 307/270 |
| 5,055,721 | 10/1991 | Majumdar et al. | 307/570 |

FOREIGN PATENT DOCUMENTS 2-87963 3/1990 Japan ................ H02M 1/08

OTHER PUBLICATIONS

Unique Chip Pair Simplfies Isolated High Side Switch Drive; O'Connor; Unitrode Integrated Circuits; Appl'n Note U-127; p. 118.

Primary Examiner—William H. Beha, Jr.
Attorney, Agent, or Firm—Watson, Cole, Grindle & Watson

[57] ABSTRACT

The invention relates to a semiconductor switch control circuit comprising a timing logic unit (1), a first and a second driver (2, 3) controlled by the timing logic unit, a first and a second transformer (T1, T2), to which the first and the second driver (2, 3), respectively, apply an unmodulated ac voltage signal (A, B) for bringing the semiconductor switch into a conducting and non-conducting state, respectively, and the secondary windings of which are connected at the opposite ends to a reference potential (RP); a first and a second rectifier (4, 5) for rectifying dc voltages (V+, V−) of opposite polarity from a voltage (A, B) acting across the secondary windings of the transformers; a first and a second driver (10, 11) for maintaining the semiconductor switch (12) in a conducting and non-conducting state, respectively; and capacitor units (8, 9) for storing the turn-on and turn-off energy of the semiconductor switch, respectively.

2 Claims, 2 Drawing Sheets

CONTROL CIRCUIT FOR A SEMICONDUCTOR SWITCH

This invention relates to a control circuit for a semiconductor switch, comprising a control unit and a transformer connected to it for generating an ac voltage signal in the secondary winding of the transformer, the ac voltage signal containing control information and control energy for the semiconductor switch; a rectifier connected to the secondary winding of the transformer for generating a dc voltage for controlling the semiconductor switch; a logic circuit for separating the control information contained in the secondary voltage of the transformer from the secondary voltage; and a driver controlled by the logic circuit for controlling the semiconductor switch, the emitter electrode of the semiconductor switch being connected to a reference potential.

Unitrode Integrated Circuits Corporation, U.S.A., for example, has designed a control circuit of the above type for a semiconductor switch, such as a FET, for its circuit pair UC3724 and UC3725. Due to the transformer, which transmits both the required power and the command signals, the control circuit is galvanically separating. To pass the control signals across the transformer, the ac voltage signal to be applied to the transformer is modulated; in this specific case, the duty cycle of the ac voltage signal is changed. A logic circuit contained in the circuit is able to detect the change in the duty cycle and to respond to the change by changing the control signal to be applied from the circuit to the gate of the semiconductor switch, the control signal bringing the semiconductor switch into a conducting or non-conducting state.

Even though such a control circuit is structurally very simple, it has certain shortcomings. First, it is able to change the potential level applied to the control electrode of the semiconductor switch only from a reference potential, to which the emitter electrode of the semiconductor switch is connected, to a positive potential which is determined mainly by the secondary voltage of the transformer. Furthermore, appropriate circuit structures are required to change the duty cycle of the ac voltage signal to be applied to the transformer. Similarly, the detection of the change in the duty cycle requires that a suitable detection circuit, such as a hysteresis comparator, should be included in the control circuit.

The object of the present invention is to provide a control circuit for a semiconductor switch where it is not necessary to modulate the ac voltage signal to be applied to the transformer and where the voltage to be applied to the control electrode of the semiconductor switch may get a negative as well as a positive value. Consequently, the control circuit according to the invention is especially suitable for controlling an IGBT (Insulated Gate Bipolar Transistor) while it is also capable of reliably controlling other type of semiconductor switches controllable through a gate or a similar control electrode, such as FETs or GTO thyristors.

To achieve the above object, the semiconductor switch control circuit according to the invention is characterized in that the control unit comprises a timing logic unit and a first and a second driver controlled by the timing logic unit, and the transformer comprises a first and a second transformer, to which the first and the second driver, respectively, applies an unmodulated ac voltage signal for bringing the semiconductor switch into a conducting an non-conducting state, respectively, and the secondary windings of which are connected at their opposite ends to said reference potential; the rectifier comprises a first and a second rectifier for rectifying a positive dc voltage and a negative dc voltage with respect to the reference potential, respectively, from the voltage acting across the secondary windings of the transformers; the driver controlled by the logic circuit comprises a first and a second driver for maintaining the semiconductor switch in a conducting and non-conducting state, respectively; and that the control circuit further comprises capacitor units connected to the outputs of the rectifiers for storing the turn-on and turn-off energy of the semiconductor switch, respectively.

As the control circuit is divided in relation to the supply of the control signal into two separate parallel paths, and the signal bringing the semiconductor switch into a conducting state is applied through one path and the signal bringing the semiconductor switch into a non-conducting state is applied through the other path, the signals can be identical unmodulated ac voltage signals. As the transformers, through which the ac voltage signals are applied to a circuit portion generating the control signal for the semiconductor switch, are connected at the opposite ends of their secondary windings to a reference potential to which the emitter electrode of the semiconductor switch is also connected, it is possible to rectify both a positive and a negative dc voltage level in relation to the reference potential from the transformer secondary. For the dc voltage levels, the circuit also comprises energy storage means used as the source of the control current for turning on and off the semiconductor switch. Especially with the IGBT, the required control current is initially relatively high but decreases rapidly after the turning on or turning off even to a very low level.

Preferably the control circuit according to the invention further comprises a short-circuit turn-off driver controlled by a logic circuit for connecting the control electrode of the semiconductor switch to the source of turn-off energy when the current flowing through the semiconductor switch exceeds a predetermined value.

As only positive half cycles are applied from the timing logic through one transformer at a reduced rate and, alternately therewith, only negative half cycles through the other transformer, the drivers bringing the semiconductor switch into a conducting or non-conducting state can be disconnected from the control circuit. In this situation the control electrode of the semiconductor switch can be caused to assume a negative potential in a controlled manner by means of the short-circuit turn-off driver, thus properly turning off the semiconductor switch.

Figure 2:
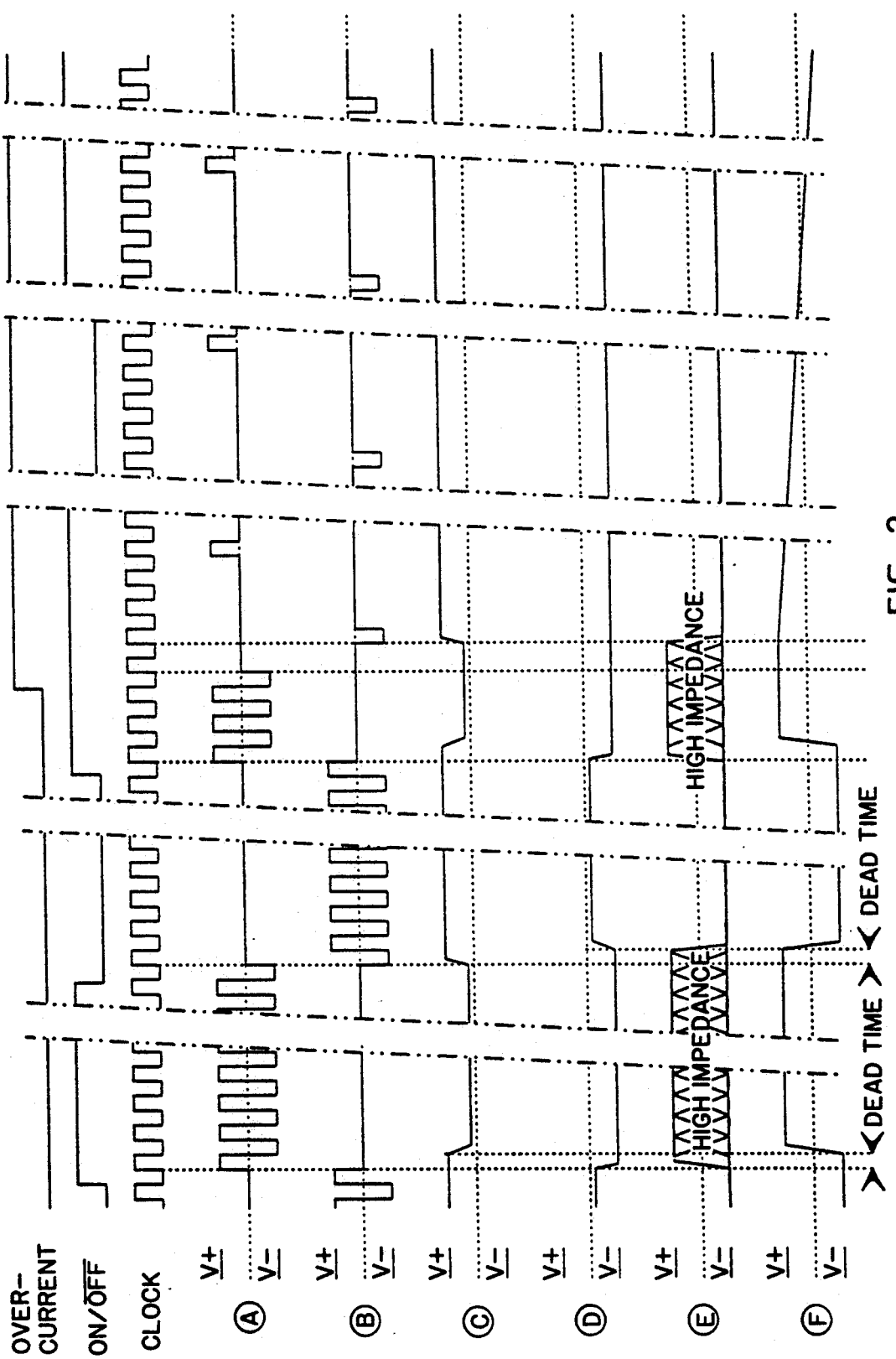

In the following the control circuit according to the invention will be described in more detail with reference to the attached drawing, in which FIG. 1 is a block diagram illustrating the structure of the control circuit according to the invention; and FIG. 2 illustrates signal waveforms facilitating the understanding of the operation of the control circuit shown in FIG. 1.

The control circuit according to the invention shown in FIG. 1 comprises a timing logic 1 which receives a signal ON/OFF bringing a semiconductor switch 12 into a conducting/non-conducting state; a clock signal CLOCK; and a signal OVER-CURRENT indicating an over-current state of the semiconductor switch. The timing logic unit 1 controls two drivers 2 and 3 which apply an ac voltage square-wave signal of a desired frequency, such as about 2 MHz, to transformers T1 and T2. The drivers 2 and 3 are controlled alternately so that when the timing logic unit receives the command signal ON causing the semiconductor switch 12 to conduct, the driver 2 alone applies the respective ac voltage signal to the transformer T1, and correspondingly, to cause the switch 12 not to conduct and to keep it in this state, the driver 3 alone applies the respective ac voltage signal to the transformer T2.

The secondary windings of the transformers T1 and T2 are connected at their opposite terminals to a reference potential RP. The ac voltage across the secondary windings is rectified both by a rectifier 4 and a rectifier 5. The voltages are also applied to a level sensing logic 6, the purpose of which is to detect through which transformer (TI or T2) the ac voltage signal is applied. In response to this information the level sensing logic 6 controls either a driver 10 or a driver 11. The driver 10 connects the gate of the switch 12 to the output of the rectifier 4 while the driver 11 connects the gate of the switch 12 to the output of the rectifier 5. In these situations the gate of the semiconductor switch 12 is connected either to a positive voltage generated by the rectifier 4 or to a negative voltage generated by the rectifier 5 when the voltage levels are compared with the reference potential, to which the emitter electrode of the semiconductor switch is connected.

To produce the required turn-on and turn-off currents, a capacitor unit 8 and 9 is connected between the rectifier 4 and the driver 10 and between the rectifier 5 and the driver 11, respectively. The capacitor units are charged during a few clock periods up to the output voltage levels of the rectifiers and have a capacity such that they are capable of supplying a current sufficient for controlling the semiconductor switch 12.

The circuit shown in FIG. 1 further comprises a short-circuit turn-off driver 7 controlled by the level sensing logic circuit 6 and capable of connecting the gate of the switch 12 through a resistor R to the source of negative potential 9. In this way, the turning off is accomplished properly.

FIG. 2 shows voltage waveforms facilitating the understanding of the operation of the circuit of FIG. 1. At the top, a voltage OVER-CURRENT is shown which is initially on a low level and then rises to a higher level when an overcurrent occurs. The following waveform represents a signal ON/$\overline{OFF}$ alternately bringing the semiconductor switch into a conducting/non-conducting state. Thereafter a clock signal CLOCK is shown, which is a square-wave signal of a desired frequency. Corresponding to the signal ON/$\overline{OFF}$, signals A and B represent the secondary voltages of the transformers T1 and T2. Control signals C and D are derived from the level sensing logic 6 for the drivers 10 and 11 on the basis of the signals A and B. A signal E, in turn, is the output signal of the short-circuit turn-off driver. It is in a high-impedance state when the signal ON/$\overline{OFF}$ is in the ON state, and in a low-impedance state when the signal is in the OFF state and especially after the transition of the over-current signal to its higher value indicating an overcurrent state. A signal F, in turn, is a signal applied to the gate of the switch 12 and comprising a period during which the switch is conducting, a period during which the switch is non-conducting, and a period during which the switch is caused to change from the conducting state to the non-conducting state by means of the short-circuit turn-off driver.

A basic idea of the control circuit according to the invention is to use two separate transformers T1 and T2 to transmit both information and energy. Information is transmitted through the transformer as a symmetrical, fully unmodulated square-wave burst synchronized with the common clock signal CLOCK (see FIG. 2, signals A and B) and having a duration equal to that of the conducting or non-conducting state of the semiconductor. Accordingly, the turn-on and turn-off signals are continuous. The transformer T1 transmits information about the turning on of the semiconductor while the transformer T2 informs about the turning off. In all situations, only one transformer is in operation at a time. Synchronization enables a parallel connection of a number of gate drivers to control semiconductors connected in parallel.

In the square wave A transmitted by the transformer T1, each positive half cycle signifies that the power driver 11 is positively caused to assume a non-conducting state; correspondingly, each negative half cycle signifies that the power driver 10 is positively caused to conduct. This means that a positive charge is applied to the gate of the semiconductor, the gate potential approaching a supply voltage V+. In other words, the semiconductor switch is turned on. As the control of the transformer T1 always starts with a positive half cycle, the power driver 11 has time to turn off during this half cycle before the power driver 10 is turned on (dead time), so that the breakthrough of the gate driver is prevented. Dead time can be adjusted by varying the clock frequency. The required turn-on energy is derived from the energy storage means 8, which is immediately recharged within a few clock periods to compensate for the dissipated energy.

In the square wave B transmitted by the transformer T2, each negative half cycle signifies that the power driver 10 is positively caused to assume a non-conducting state; correspondingly, each positive half cycle signifies that the power driver 11 is positively caused to conduct. This means that a negative charge is applied to the gate of the semiconductor, the gate potential approaching a supply voltage V−. In other words, the semiconductor switch is turned off. As the control of the transformer T2 always starts with a negative half cycle, the power driver 10 has time to turn off during the half cycle before the power driver 11 is turned on (dead time), so that the breakthrough of the gate driver is prevented. Dead time can be adjusted by varying the clock frequency. The required turn-off energy is derived from the energy storage means 9, which is immediately recharged within a few clock periods to compensate for the dissipated energy.

In a short-circuit situation, the signal OVERCURRENT from an external logic forces the timing logic 1 to apply, alternately and at a reduced rate, positive half cycles to the transformer T1 and negative half cycles to the transformer T2. As described above, the positive half cycles from T1 force the power driver 11 to assume a non-conducting state, and the negative half cycles from T2 force the power driver 10 to do the same. In other words, the gate is disconnected from both energy storage means. The short-circuit turn-off driver 7 connects the gate through the turn-off resistor R to the negative energy storage means 9 if both power drivers have simultaneously been caused to assume a non-conducting state. In this way, the turning off is accomplished properly.

The semiconductor switch control circuit according to the invention has been described above by way of example by means of a single specific embodiment, and it is to be understood that it can be modified in some respects, especially in accordance with the properties of the semiconductor switch to be controlled in each particular case, without, however, deviating from the scope of protection defined in the attached claims

I claim:

1. A control circuit for a semiconductor switch, comprising
    a control unit (1 to 3) and a transformer (T1, T2) connected to it for generating an ac voltage signal (A, B) in the secondary winding of the transformer, the ac voltage signal containing control information and control energy for the semiconductor switch (12);
    a rectifier (4, 5) connected to the secondary winding of the transformer (T1, T2) for generating a dc voltage (V+, V−) for controlling the semiconductor switch;
    a logic circuit (6) for separating the control information contained in the secondary voltage of the transformer from the secondary voltage, and a driver (10, 11) controlled by the logic circuit (6) for controlling the semiconductor switch (12), the emitter electrode of the semiconductor switch being connected to a reference potential (RP),
    c h a r a c t e r i z e d in that
    the control unit comprises a timing logic unit (1) and a first and a second driver (2, 3) controlled by the timing logic unit (1), and the transformer comprises a first and a second transformer (T1, T2), to which the first and the second driver (2, 3), respectively, applies an unmodulated ac voltage signal (A, B) for bringing the semiconductor switch into a conducting and non-conducting state, respectively, and the secondary windings of which are connected at their opposite ends to said reference potential (RP);
    the rectifier comprises a first and a second rectifier (4, 5) for rectifying a positive dc voltage (V+) and a negative dc voltage (V−) with respect to the reference potential, respectively, from the voltage (A, B) acting across the secondary windings of the transformers;
    the driver controlled by the logic circuit (6) comprises a first and a second driver (10, 11) for maintaining the semiconductor switch in a conducting and non-conducting state, respectively; and
    that the control circuit further comprises capacitor units (8, 9) connected to the outputs of the rectifiers for storing the turn-on and turn-off energy of the semiconductor switch, respectively.

2. A control circuit according to claim 1, c h a r a c t e r i z e d in that it further comprises a short-circuit turn-off driver (7) controlled by the logic circuit (6) for connecting the control electrode of the semiconductor switch (12) to a source of turn-off energy (V−) when a current flowing through the semiconductor switch exceeds a predetermined value.

* * * * *